US012677403B2

(12) United States Patent　　　　(10) Patent No.:　　US 12,677,403 B2
Park et al.　　　　　　　　　　　　(45) Date of Patent:　　　Jul. 7, 2026

(54) DISPLAY DEVICE INCLUDING VAPOR CHAMBERS

(71) Applicant: Samsung Display Co., Ltd., Yongin-si (KR)

(72) Inventors: Byoung Kyoo Park, Yongin-si (KR); Ja Hun Koo, Yongin-si (KR); Yong Il Kim, Yongin-si (KR); Wee Joon Jeong, Yongin-si (KR); Jang Un Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 121 days.

(21) Appl. No.: 18/594,745

(22) Filed: Mar. 4, 2024

(65) Prior Publication Data

US 2025/0040112 A1　　Jan. 30, 2025

(30) Foreign Application Priority Data

Jul. 25, 2023　(KR) ........................ 10-2023-0096908

(51) Int. Cl.
　H05K 7/00　　　(2006.01)
　H05K 7/20　　　(2006.01)
(52) U.S. Cl.
　CPC ....... H05K 7/2099 (2013.01); H05K 7/20963 (2013.01)
(58) Field of Classification Search
　CPC ............. H05K 7/2099; H05K 7/20963; H05K 7/20336; H05K 7/20472; G09F 9/00
　See application file for complete search history.

(56) References Cited

U.S. PATENT DOCUMENTS

| | | | | | |
|---|---|---|---|---|---|
| 7,164,586 | B2 * | 1/2007 | Lin | ..................... | H05K 7/20972 |
| | | | | | 348/794 |
| 7,269,009 | B2 * | 9/2007 | Ryu | ..................... | H05K 5/0213 |
| | | | | | 361/679.48 |
| 8,289,715 | B2 * | 10/2012 | Takahara | ............. | H05K 7/2099 |
| | | | | | 348/836 |
| 11,019,735 | B2 * | 5/2021 | Dunn | ..................... | G09F 27/005 |
| 11,054,693 | B2 * | 7/2021 | Teragawa | .......... | G02F 1/133385 |
| 11,310,940 | B2 | 4/2022 | Moon et al. | | |
| 11,547,028 | B2 | 1/2023 | Jung et al. | | |
| 11,751,431 | B2 * | 9/2023 | Park | .......................... | G06F 1/20 |
| | | | | | 257/72 |

(Continued)

FOREIGN PATENT DOCUMENTS

| | | |
|---|---|---|
| KR | 102487229 B1 | 6/2019 |
| KR | 102099255 B1 | 4/2020 |

(Continued)

*Primary Examiner* — Rockshana D Chowdhury
(74) *Attorney, Agent, or Firm* — Innovation Counsel LLP

(57) ABSTRACT

A display device includes: a display panel; a heat dissipation sheet on a surface of the display panel; a circuit board electrically connected to the display panel, the circuit board being on a surface of the heat dissipation sheet; and a vapor chamber attached to the surface of the heat dissipation sheet to emit heat transferred through the heat dissipation sheet. The circuit board overlaps with a first area of the heat dissipation sheet. A first part of the vapor chamber is attached to a second area of the heat dissipation sheet, and a second part of the vapor chamber is spaced apart from the heat dissipation sheet.

15 Claims, 10 Drawing Sheets

(56) References Cited

U.S. PATENT DOCUMENTS

| | | | | |
|---|---|---|---|---|
| 11,778,757 | B2 * | 10/2023 | Dunn | H05K 5/03 |
| | | | | 361/679.46 |
| 11,968,813 | B2 * | 4/2024 | Dunn | G09F 15/005 |
| 12,007,173 | B2 * | 6/2024 | Cheng | F28D 15/046 |
| 12,153,479 | B2 * | 11/2024 | Dunn | G06F 1/20 |
| 12,161,019 | B2 * | 12/2024 | Park | G06F 1/20 |
| 12,356,572 | B2 * | 7/2025 | Kim | G06F 1/1626 |
| 2006/0158851 | A1 * | 7/2006 | Bae | H05K 7/2099 |
| | | | | 361/700 |
| 2008/0165496 | A1 * | 7/2008 | Kang | G02F 1/133385 |
| | | | | 361/692 |
| 2012/0236499 | A1 * | 9/2012 | Murayama | H05K 7/20972 |
| | | | | 361/696 |
| 2012/0255721 | A1 * | 10/2012 | Kim | G02F 1/133382 |
| | | | | 362/97.1 |
| 2016/0135331 | A1 * | 5/2016 | Wu | G06F 1/1643 |
| | | | | 361/700 |
| 2016/0198589 | A1 * | 7/2016 | Kang | H05K 7/20154 |
| | | | | 361/692 |
| 2017/0083043 | A1 * | 3/2017 | Bowers | G06F 1/20 |
| 2018/0263138 | A1 * | 9/2018 | Wu | H05K 7/2099 |
| 2019/0021189 | A1 * | 1/2019 | Kim | H05K 7/20972 |
| 2019/0182981 | A1 * | 6/2019 | Huang | G02F 1/1336 |
| 2023/0061651 | A1 | 3/2023 | Jeong et al. | |
| 2024/0318921 | A1 * | 9/2024 | Liu | F28D 15/046 |

FOREIGN PATENT DOCUMENTS

| | | | |
|---|---|---|---|
| KR | 102390901 | B1 | 11/2021 |
| KR | 102407157 | B1 | 2/2022 |
| KR | 1020230033178 | A | 3/2023 |
| WO | 2015170828 | A1 | 11/2015 |

* cited by examiner

DISPLAY DEVICE INCLUDING VAPOR CHAMBERS

CROSS-REFERENCE TO RELATED APPLICATION

This patent document claims priority under 35 U.S.C. § 119(a) to Korean patent application No. 10-2023-0096908 filed on Jul. 25, 2023 in the Korean Intellectual Property Office, the entirety of which is incorporated herein by reference.

BACKGROUND

1. Technical Field

The present disclosure generally relates to a display device, and more particularly, to a display device having an efficient heat dissipation structure.

2. Related Art

Modern display panels provide high performance and image quality and consequently generate a large amount of heat when driven. To maintain their performance, display panels generally need to expel the generated heat. Accordingly, vapor chambers have been used for heat dissipation.

In general, when heat is applied to one side of a vapor chamber, a phase change material evaporates in an internal space of a corresponding heating part, and the evaporated phase change material rapidly moves to the other side of the vapor chamber, where the heat is not applied, resulting in condensation of the phase change material. Repeating such a process moves heat from the heating part through a condensing part to the outside.

A conventional heat dissipation structure using the vapor chamber has limited efficiency when dissipating heat intensively generated in a specific zone of a display panel.

The above information disclosed in this Related Art section is only for enhancement of understanding of the background of the disclosure and may contain information that does not form the prior art and that was not publicly used or known before the effective filing date of this document.

SUMMARY

Embodiments provide a display device capable of using a vapor chamber to uniformly and efficiently emit heat generated in driving of the display panel.

In accordance with an aspect of the present disclosure, there is provided a display device including: a display panel; a heat dissipation sheet disposed on a surface of the display panel; a circuit board electrically connected to the display panel, the circuit board being disposed on a surface of the heat dissipation sheet; and a vapor chamber attached to the surface of the heat dissipation sheet to emit heat transferred through the heat dissipation sheet, wherein the circuit board overlaps with a first area of the heat dissipation sheet, and wherein a first part of the vapor chamber is attached to a second area of the heat dissipation sheet, and a second part of the vapor chamber is spaced apart from the heat dissipation sheet.

The vapor chamber may include: an external member defining an internal space; and a phase change material disposed in the internal space, the phase change material being convected by the heat transferred through the heat dissipation sheet, thereby emitting the heat transferred through the heat dissipation sheet.

The vapor chamber may include an absorbing sheet disposed in the internal space of the external member, the absorbing sheet including a plurality of holes, thereby absorbing the phase change material.

The second part of the vapor chamber may include a third part and a fourth part. The third part of the vapor chamber may extend from the first part of the vapor chamber and form a first angle with the first part of the vapor chamber. The fourth part of the vapor chamber may extend from the third part of the vapor chamber and form a second angle with the third part of the vapor chamber.

The display device may further include an additional heat dissipation member coupled to the vapor chamber through an adhesive member. The vapor chamber may be disposed between the heat dissipation sheet and the additional heat dissipation member.

The additional heat dissipation member may include at least one of a tungsten-copper composite material, a molybdenum-copper composite material, graphite, stainless steel, and an electrolytic zinc-coated steel sheet.

The display device may further include a rotating member coupled to the additional heat dissipation member, the rotating member generating an air current toward the vapor chamber.

In accordance with another aspect of the present disclosure, there is provided a display device including: a display panel; a heat dissipation sheet disposed on a surface of the display panel; a vapor chamber attached to a surface of the heat dissipation sheet, to emit heat transferred through the heat dissipation sheet; and a circuit board electrically connected to the display panel, the circuit board being attached to the heat dissipation sheet, wherein the circuit board overlaps with a first area of the heat dissipation sheet, and wherein a first part of the vapor chamber is attached to a second area of the heat dissipation sheet, and second and third parts of the vapor chamber are spaced apart from the heat dissipation sheet.

The second part of the vapor chamber may extend in a direction intersecting an extending direction of the first part of the vapor chamber from the first part of the vapor chamber, and the third part of the vapor chamber may extend in a direction intersecting an extending direction of the second part of the vapor chamber from the second part of the vapor chamber.

The third part of the vapor chamber may be parallel to the first part of the vapor chamber.

The second part of the vapor chamber may be right-angled with respect to the first part of the vapor chamber, and the third part of the vapor chamber may be right-angled with the second part of the vapor chamber.

BRIEF DESCRIPTION OF THE DRAWINGS

Example embodiments will be described more fully hereinafter with reference to the accompanying drawings; however, embodiments of the present disclosure may take different forms and should not be construed as limited to the specific embodiments set forth herein. Rather, these embodiments are provided so that this disclosure will be thorough and complete and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
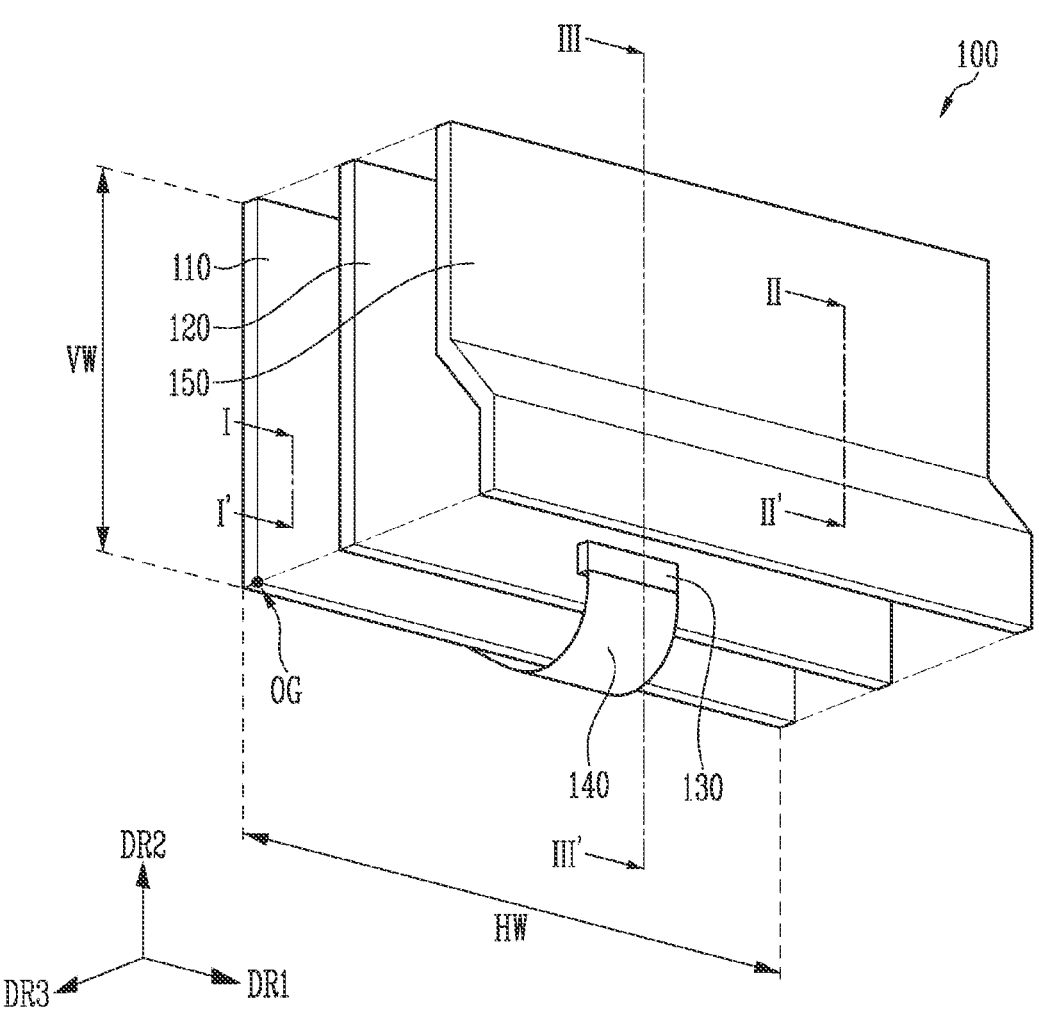
FIG. 1 is an exploded perspective view illustrating a display device in accordance with an embodiment of the present disclosure.

Hereinafter, embodiments of the present disclosure will be described in more detail with reference to the accompanying drawings. In the description below, only parts necessary to understand aspects of the present disclosure may be described, and the descriptions of other parts may be omitted in order not to unnecessarily obscure the subject matter of the present disclosure. In addition, the present disclosure is not limited to exemplary embodiments described herein but may be embodied in various different forms. Rather, exemplary embodiments described herein are provided to thoroughly and completely describe the disclosed contents and to sufficiently transfer the ideas of the disclosure to a person of ordinary skill in the art.

In the entire specification, when an element is referred to as being "connected" or "coupled" to another element, the element can be directly connected or coupled to the other element or be indirectly connected or coupled to the other element with one or more intervening elements interposed therebetween. The technical terms used herein are used only for the purpose of illustrating a specific embodiment and not intended to limit the embodiment. When a component "includes" an element, unless further limitations are expressly stated herein, it should be understood that the component does not exclude another element but may further include another element. It will be understood that for the purposes of this disclosure, "at least one of X, Y, and Z" can be construed as X only, Y only, Z only, or any combination of two or more items X, Y, and Z (e.g., XYZ, XYY, YZ, ZZ). Similarly, for the purposes of this disclosure, "at least one selected from the group consisting of X, Y, and Z" can be construed as X only, Y only, Z only, or any combination of two or more items X, Y, and Z (e.g., XYZ, XYY, YZ, ZZ).

It will be understood that, although the terms "first", "second," etc. may be used herein to describe various elements, these elements should not be limited by these terms. These terms are only used to distinguish one element from another element. Thus, a "first" element discussed below could also be termed a "second" element without departing from the teachings of the present disclosure.

Spatially relative terms, such as "below," "above," and the like, may be used herein for ease of description to describe the relationship of one element to another element, as illustrated in the figures. It will be understood that the spatially relative terms, as well as the illustrated configurations, are intended to encompass different orientations of the apparatus in use or operation in addition to the orientations described herein and depicted in the figures. For example, if the apparatus in the figures is turned over, elements described as "below" or "beneath" other elements or features would then be oriented "above" the other elements or features. Thus, the exemplary term, "above," may encompass both an orientation of above and below. The apparatus may be otherwise oriented (e.g., rotated 90 degrees or at other orientations) and the spatially relative descriptors used herein interpreted accordingly.

In addition, the embodiments of the disclosure are described here with reference to schematic diagrams of ideal embodiments (and intermediate structures) of the present disclosure, so that changes in a shape as shown due to, for example, manufacturing technology and/or a tolerance may be expected. Therefore, the embodiments of the present disclosure shall not be limited to the specific shapes of regions shown here, but include shape deviations caused by, for example, the manufacturing technology. The regions shown in the drawings are schematic in nature, and the shapes thereof do not necessarily represent the actual shapes of the regions of the device and do not limit the scope of the disclosure.

FIG. 1 is an exploded perspective view illustrating a display device 100 in accordance with an embodiment of the present disclosure.

Referring to FIG. 1, the display device 100 may include a display panel 110, a heat dissipation sheet 120, a circuit board 130, and a vapor chamber 150. The display panel 110 may be electrically connected to the circuit board 130 through a connection circuit board 140. In some embodiments, the display device 100 may be a large-sized display device such as a television, a monitor or an external advertisement board.

The display panel 110 may include a display surface extending in a first direction DR1 and a second direction DR2 intersecting the first direction DR1. The display panel 110 may display an image that is viewable from a third direction DR3 intersecting the first and second directions DR1 and DR2 through the display surface. The display panel 110 may have a three-dimensional structure extending in the first to third directions DR1 to DR3. For example, the display panel 100 may have a shape such as a rectangular parallelepiped or a regular hexahedron in the first and second directions DR1 and DR2 and a thickness extending in the third direction DR3. A length of the display panel 110 in the first direction DR1 may be referred to as a horizontal width HW, and a length of the display panel 110 in the second direction DR2 may be referred to as a vertical width VW. An end of the display panel 110 in the first direction DR1 and the second direction DR2 may be referred to as an origin OG.

The heat dissipation sheet 120 may be disposed on a surface of the display panel 110. The heat dissipation sheet 120 may include a material having a high thermal conductivity, such as a tungsten-copper composite material, a molybdenum-copper composite material, or graphite.

The heat dissipation sheet 120 is configured to receive heat generated in and transferred from the display panel 110 and to emit or conduct the transferred heat. For example, the heat dissipation sheet 120 may transfer the heat from the display panel 110 to the vapor chamber 150, and the vapor chamber 150 may emit the transferred heat to the surrounding environment outside of the display device 100.

If the vapor chamber 150 were disposed directly on the lower or back surface of the display panel 110, heat emission through the vapor chamber 150 may not be uniform. For example, a phase change material inside the vapor chamber 150 is evaporated by absorbing heat from the display panel 110. An area in which a relatively small amount of heat is generated may exist in the display panel 110, and the phase change material inside the vapor chamber 150 may condense in the vicinity of the area. Heat emission from the vapor chamber 150 to the air in the surrounding environment may not be the same in an area where the evaporated phase change material flows and an area where the evaporated phase change material is condensed. If heat emission through the vapor chamber 150 is not uniform, a rapid temperature gradient may occur between the area in which the phase change material evaporated in the vapor chamber 150 flows and the area in which the phase change material evaporated in the vapor chamber 150 is condensed.

On the other hand, in accordance with the illustrated embodiment of the present disclosure, the heat dissipation sheet 120 has a high thermal conductivity and is disposed between the display panel 110 and the vapor chamber 150, so that heat transferred from the display panel 110 can be uniformly transferred to the entire surface of the heat dissipation sheet 120. Accordingly, heat emission through the vapor chamber 150 can be more uniform, and a temperature gradient between the area where the evaporated phase change material flows and the area where the evaporated phase change material is condensed can be avoided or reduced.

The circuit board 130 may be disposed on a lower or back surface of the heat dissipation sheet 120. In embodiments, the circuit board 130 may be attached to the lower or back surface opposite to an upper or front surface of the heat dissipation sheet 120, which faces the display panel 110. The circuit board 130 and the display panel 110 may be electrically connected to each other through the connection circuit board 140.

At least one circuit element may be mounted on the circuit board 130. The circuit element may receive image data and control signals from an external graphic controller (not shown). The circuit element may provide the display panel 110 with a control signal, a driving signal, and the like.

The connection circuit board 140 may electrically connect the display panel 110 and the circuit board 130 to each other. The connection circuit board 140 may receive a control signal, a driving signal, and the like, which the circuit board 130 provides. Also, the connection circuit board 140 may transfer the control signal, the driving signal, and the like from the circuit board 130 to the display panel 110.

The connection circuit board 140 may include a flexible material. The connection circuit board 140 may be bent with a predetermined curvature. One side or end of the connection circuit board 140 may be connected to the display panel 110, and the other side or end of the connection circuit board 140 may be connected to the circuit board 130. A portion of the vapor chamber 150 may be attached to the lower or back surface of the heat dissipation sheet 120, and another portion of the vapor chamber 150 may be spaced apart from the heat dissipation sheet 120.

The vapor chamber 150 may include a phase change material. As the portion of the vapor chamber 150 is attached to the lower or back surface (facing the third direction DR3) of the heat dissipation sheet 120, the vapor chamber 150 may receive heat emitted and transferred from the heat dissipation sheet 120. The heat transferred from the heat dissipation sheet 120 may be introduced into the vapor chamber 150, and a temperature inside the vapor chamber 150 may reach a boiling point of the phase change material. In particular, the state of the phase change material may evaporate and change to a vapor state or phase where the vapor chamber 150 is in direct contact with the heat dissipation sheet 120.

Another portion of the vapor chamber 150 is not attached directly to the lower or back surface of the heat dissipation sheet 120 but may be spaced apart from the lower or back surface of the heat dissipation sheet 120. Therefore, only a relatively small amount of heat may be transferred from the heat dissipation sheet 120 to the spaced-apart portion of the vapor chamber 150. A temperature of the spaced-apart portion of the vapor chamber 150 may therefore be lower than the boiling point of the phase change material.

The phase change material in a vapor phase inside the vapor chamber may emit heat where the vapor chamber 150 transfers the atmosphere, so that the phase change material may be condensed into a liquid phase from the vapor phase. The phase change material may transfer heat through repetition of the above-described process in which the phase change material evaporates on one side of the vapor chamber 150 and condenses on the other side of the vapor chamber 150. A heat emission process using the vapor chamber 150 will be described in more detail with reference to FIG. 4.

Figure 2:
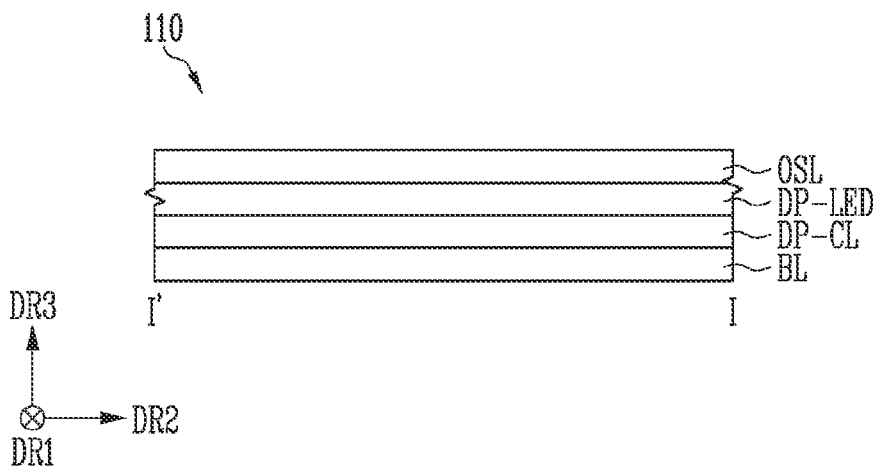
FIG. 2 is a sectional view taken along line I-I' of a display panel shown in FIG. 1.

FIG. 2 is a sectional view taken along line I-I' of a display panel shown in FIG. 1.

Referring to FIGS. 1 and 2, the display panel 110 may include a base layer BL, a circuit element layer DP-CL, a display element layer DP-LED, and an optical structure layer OSL.

The base layer BL may have a three-dimensional shape extending in the first direction DR1, the second direction DR2, and the third direction DR3. For example, the base layer BL may have an area and a major surface extending in the first and second directions DR1 and DR2 and have a thickness extending in the third direction. The base layer BL may include a synthetic resin substrate or a glass substrate.

The circuit element layer DP-CL may be attached to the base layer BL to be in contact with the base layer BL. The circuit element layer DP-CL may have a three-dimensional shape with an area extending in the first direction DR1 and the second direction DR2 and a layer thickness extending generally in the third direction DR3.

The circuit element layer DP-CL may include at least one insulating layer and one or more circuit elements. The circuit elements in the circuit element layer DP-CL may include a signal line, a driving circuit of a pixel, and the like.

A process of forming the circuit element layer DP-CL may include a process of forming an insulating layer, a semiconductor layer, and a conductive layer, which may be performed through coating, deposition, or the like, and a process of patterning the insulating layer, the semiconductor layer, and the conductive layer, which may be performed through a photolithography process.

The display element layer DP-LED may be attached to the circuit element layer DP-CL to be in contact with a major surface of the circuit element layer DP-CL with a layer thickness extending generally in the third direction DR3. The display element layer DP-LED may include at least one display element.

The optical structure layer OSL may be attached to the display element layer OP-LED to be in contact with the display element layer OP-LED. The optical structure layer OSL may have a three-dimensional shape with an area extending in the first direction DR1 and the second direction DR2 and a layer thickness extending in the third direction DR3.

The optical structure layer OSL may convert a color of light provided from the display element included in the display element layer DP-LED. The optical structure layer OSL may include a light control pattern and a structure for increasing conversion efficiency of light.

In embodiments, the display panel 110 may further include other components in addition to the components of the display panel 110 shown in FIG. 2. In embodiments, the components of the display panel 110 shown in FIG. 2 may be variously modified or omitted.

Figure 3:
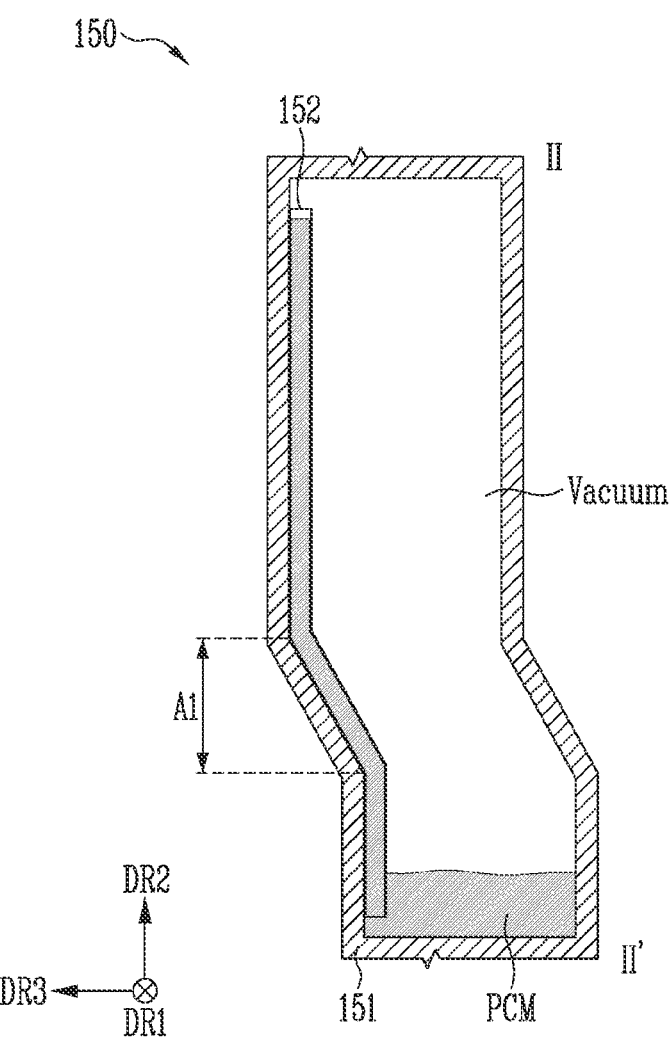
FIG. 3 is a sectional view taken along line II-II' of a vapor chamber shown in FIG. 1.

FIG. 3 is a sectional view taken along line II-II' of the vapor chamber 150 shown in FIG. 1.

Referring to FIGS. 1 and 3, the vapor chamber 150 may include an external member or housing 151, an absorbing sheet 152, and a phase change material PCM.

The external member or housing 151 may form or define an internal space of the vapor chamber 150, and the internal space may maintain a vacuum state Vacuum. The external member 151 may include a material having a high thermal conductivity, such as a tungsten-copper composite material, a molybdenum-copper composite material, or graphite. The heat dissipation sheet 120 may alternatively or additionally include a metallic material having a thermal conductivity that is not as high, such as stainless steel (SUS) or an electrolytic zinc-coated steel sheet (SECC).

The phase change material PCM in a liquid phase may only occupy part of the internal space of the vapor chamber 150. To place the phase change material PCM inside the internal space of the vapor chamber 150, a hole may be punched at the external member 151, a copper tube capable of injecting the phase change material PCM into the punched hole may be welded to the hole, and the phase change material PCM may be injected through the copper tube. Water or the like may be used as the phase change material PCM.

The absorbing sheet 152 may be adhered closely to a side surface of the internal space of the external member 151. For example, the absorbing sheet 152 may be attached to a side surface of the internal space of the external member 151, which is adjacent to the heat dissipation sheet 120. The absorbing sheet 152 may be highly or super absorbent of the phase change material PCM, have a chemical resistance so that the absorbing sheet 152 does not react with the phase change material PCM, and provide a capillary force with which the absorbing sheet 152 may draw the phase change material PCM in the direction opposing of gravity. The absorbing sheet 152 may have a plurality of holes to have an efficient capillary force.

At least a portion of the phase change material PCM may be absorbed in the entirety of the absorbing sheet 152. For example, the absorbing sheet 152 may draw the phase change material PCM (in the liquid phase) in the opposite direction of the gravity from the bottom to the top of the absorbing sheet 152. In the example of FIG. 3, in a first area A1, the absorbing sheet 152 may draw the phase change material PCM along the heated side of the external member 151 including in the second direction DR2 as the direction opposite of the gravity.

A surplus phase change material PCM which is not absorbed in the absorbing sheet 152 may be located at one side (the bottom) of the internal space of the external member 151. A condensation phenomenon of the phase change material PCM may occur in the vicinity of an area in which the surplus phase change material PCM is located. The heat emission process using the vapor chamber 150 will be described in more detail with reference to FIG. 4.

Figure 4:
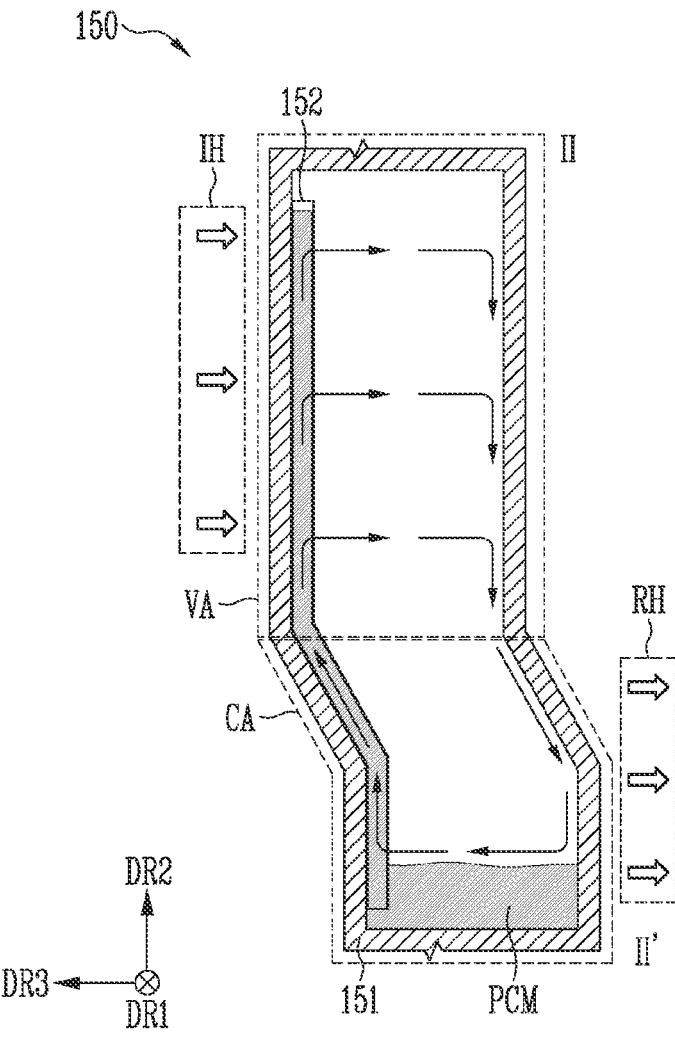
FIG. 4 is a sectional view illustrating a heat emission process of the vapor chamber shown in FIG. 1.

FIG. 4 is a sectional view illustrating a heat emission process in the vapor chamber 150 of FIG. 1.

Referring to FIGS. 1 and 4, the vapor chamber 150 may be divided into an evaporation area VA where the phase change material PCM evaporates and a condensation area CA where the phase change material PCM condenses. The surplus phase change material PCM in the liquid phase may pool in the condensation area CA. By the capillary force of the absorbing sheet 152 described above, the absorbing sheet 152 may absorb the phase change material PCM and draw the phase change material PCM from the condensation area CA up into the evaporation area VA.

In the evaporation area VA of the vapor chamber 150, one surface of the external member 151 may be attached to the heat dissipation sheet 120, which is adjacent in the third direction DR3. A portion of the external member 151 attached to the heat dissipation sheet 120 may be defined as a heat introduction area IH. Heat emitted from the heat dissipation sheet 120 may be conducted to the corresponding surface of the external member 151 in the heat introduction area HI. As heat is introduced to the internal space of the vapor chamber 150 through the external member 151, a temperature of the internal space of the vapor chamber 150 in the evaporation area VA may reach a boiling point of the phase change material PCM or may at least be high enough to cause significant evaporation of the phase change material PCM in the absorbing sheet 152. As the phase change material PCM absorbed in a portion of the absorbing sheet 152 overlapping with the evaporation area VA is evaporated, the state of the phase change material PCM may change from the liquid phase to a vapor phase. The absorbing sheet 152 may respond by drawing more of the liquid phase change material PCM into the evaporation area VA.

In the condensation area CA of the vapor chamber 150, one surface of the external member 151 is not attached to the heat dissipation sheet 120 but may be spaced apart from the heat dissipation sheet 120. Accordingly, an amount of heat transferred to the condensation area CA from the heat dissipation sheet 120 may be small, and a temperature in the condensation area CA of the vapor chamber 150 may be lower than the boiling point of the phase change material PCM.

The phase change material PCM in a vapor phase, when in the condensation area CA inside the vapor chamber 150, may emit heat to the external member 151 while the external member transfers the heat to the atmosphere. See the arrows in a heat emission area RH. As a result, the phase change material PCM may condense from the vapor phase into the liquid phase. The condensed phase change material PCM may be re-absorbed in the absorbing sheet 152. The phase change material PCM that the absorbing sheet 152 reabsorbs and transports from the condensation area CA to the evaporation area VA may collect heat from the heat introduction area HI, evaporate, flow to the outer side of the external member 151, emit heat to the outside through the heat emission area RH of the external member 151, and condense and return to the condensation area CA. Repetition of the above-described cycle (see the arrows in the internal space of the chamber 150) can continuously remove heat from the absorbing sheet 152.

The separation between the closest surfaces of the condensation area CA and the heat dissipation sheet 120 can improve the heat flow through the vapor condensation chamber 150. If the surface of the external member 151 that is in the condensation area CA of the vapor chamber 150 was instead in direct contact with the heat dissipation sheet 120, a difference between amounts of heat transferred from the heat dissipation sheet 120 in the condensation area CA and the evaporation area VA may not be large. Accordingly, convection of the phase change material PCM in the internal space of the vapor chamber 150 may not be smooth, and heat emission through the vapor chamber 150 may not be smooth.

In accordance the illustrated embodiment of FIG. 4, the one surface of the external member 151 in the condensation area CA of the vapor chamber 150 is spaced apart from the heat dissipation sheet 120, so that the difference between amounts of heat transferred from the heat dissipation sheet 120 in the condensation area CA and the evaporation area VA may be relatively large. Accordingly, the convection of the phase change material PCM in the internal space of the vapor chamber 150 can be improved, and heat emission through the vapor chamber 150 may be smooth.

Figure 5:
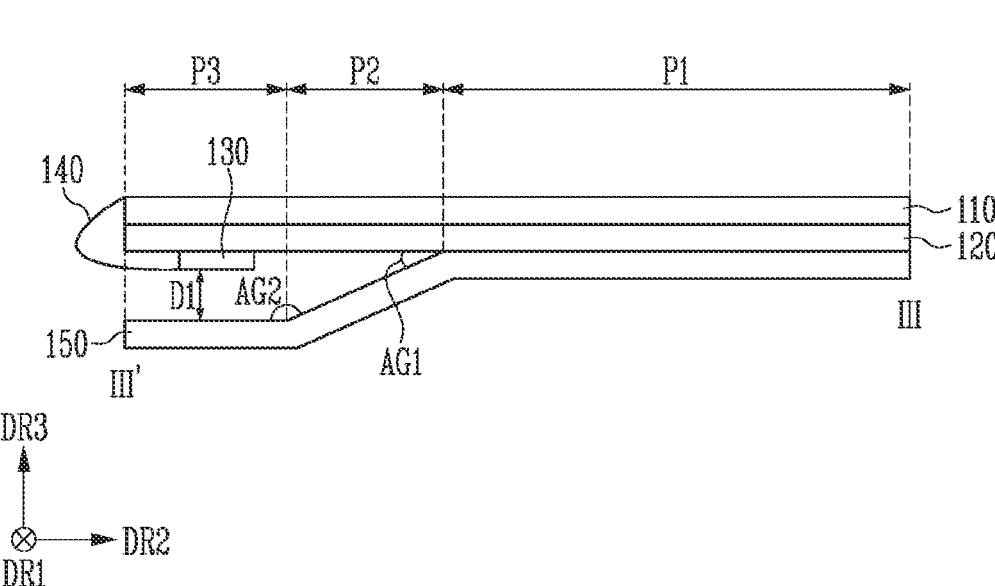
FIG. 5 is a sectional view taken along line III-III' of the display device shown in FIG. 1.

FIG. 5 is a sectional view taken along line III-III' of the display device shown in FIG. 1.

Referring to FIGS. 1 and 5, the vapor chamber 150 may be divided into first to third parts P1 to P3.

The first part P1 of the vapor chamber 150 may be in direct contact with a surface of the heat dissipation sheet 120 facing the third direction DR3. On the other hand, the third part P3 of the vapor chamber 150 may be spaced apart from the heat dissipation sheet 120. The second part P2 of the vapor chamber 150 extends from the first part P1 of the vapor chamber 150 and may form a first angle AG1 with the heat dissipation sheet 120. The third part P3 of the vapor chamber 150 extends from the second part P2 of the vapor chamber 150 and may form a second angle AG2 with the second part P2 of the vapor chamber 150.

At the third part P3 of the vapor chamber 150, the vapor chamber 150 may be spaced apart from the circuit board 130 or the connection circuit board 140 at a first distance D1. In addition, the third part P3 of the vapor chamber 150 may overlap with all or part of the circuit board 139 and the connection circuit board 140 when viewed along the third direction DR3. The vapor chamber 150 may thus protect the circuit board 130 from external impact transferred in the third direction DR3.

A shape at the second and third parts P2 and P3 of the vapor chamber 150 in the example of FIG. 5 may vary according to the first angle AG1 and the second angle AG2. Further, embodiments of the vapor chamber 150 are not limited to the shape shown in FIG. 5.

Figure 6:
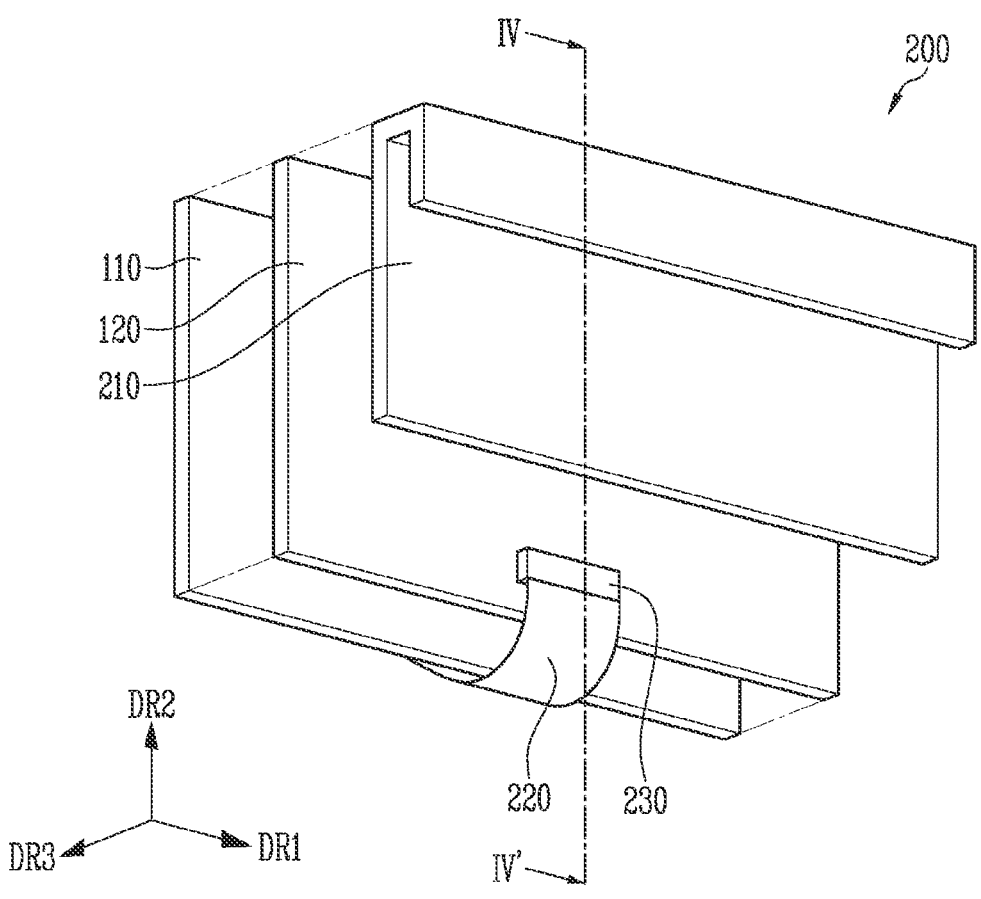
FIG. 6 is an exploded perspective view illustrating a display device in accordance with another embodiment of the present disclosure.

FIG. 6 is an exploded perspective view illustrating a display device in accordance with another embodiment of the present disclosure.

Referring to FIG. 6, the display device 200 may include a display panel 110, a heat dissipation sheet 120, a vapor chamber 210, a connection circuit board 220, and a circuit board 230.

The vapor chamber 210 may be in contact with the heat dissipation sheet 120. A surface of the vapor chamber 210 facing the display panel 110, i.e., facing in the third direction DR3, may be in direct contact with the heat dissipation sheet

120. Other surfaces of the vapor chamber 210 may face away from or be separated from the heat dissipation sheet 120. A shape of the vapor chamber 210 will be described in more detail with reference to FIG. 7.

The circuit board 230 may be attached to the heat dissipation sheet 120 as shown in FIG. 6. Also, the circuit board 230 may be electrically connected to the display panel 110 through the connection circuit board 220.

Figure 7:
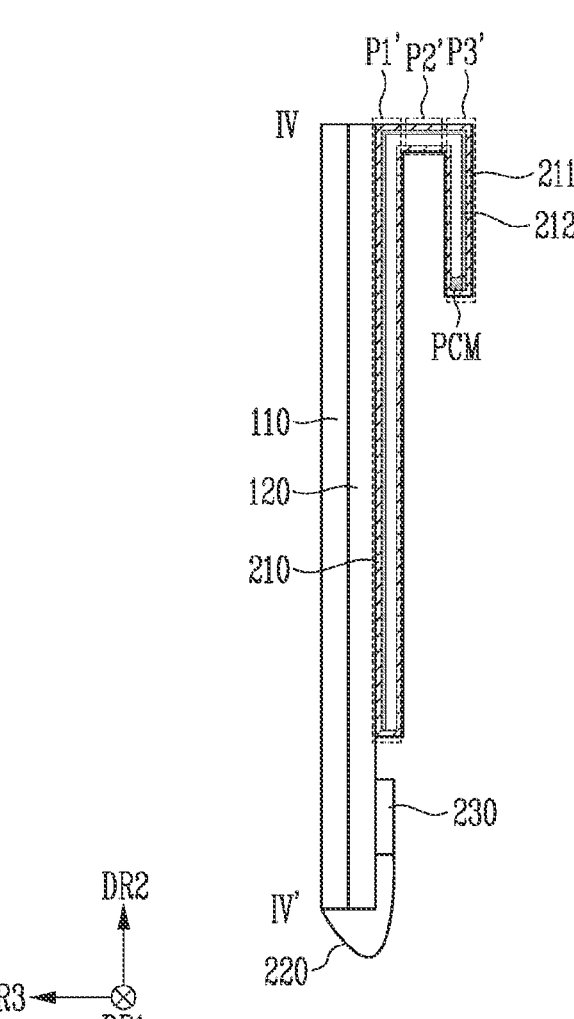
FIG. 7 is a sectional view taken along line IV-IV' of the display device shown in FIG. 6.

FIG. 7 is a sectional view taken along line IV-IV' of the display device shown in FIG. 6.

Referring to FIGS. 6 and 7, the vapor chamber 210 may include first to third parts P1' to P3'.

A surface of the first part P1' of the vapor chamber 210 facing the third direction may be in contact, e.g., direct contact, with the heat dissipation sheet 120. On the other hand, the second and third parts P2' and P3' of the vapor chamber 210 may be spaced apart from the heat dissipation sheet 120.

The second part P2' of the vapor chamber 210 may form a right angle with the first part P1' of the vapor chamber 210. The third part P3' of the vapor chamber 210 may form a right angle with the second part P2 of the vapor chamber 210. Accordingly, the third part P3' of the vapor chamber 210 may be substantially parallel to the first part P1' of the vapor chamber 210. The vapor chamber 210 may include an external member 211 or housing defining an interior space containing a phase change material PCM and an absorbing sheet 212. The vapor chamber 210 may particularly operate to transfer heat in the manner described above but with the first part P1' providing the evaporation area and the second or third part P2' or P3' providing the condensation area.

The circuit board 230 may be disposed on the surface of the heat dissipation sheet 120 in an area to which the vapor chamber 210 is not attached as shown in FIG. 7.

Figure 8:
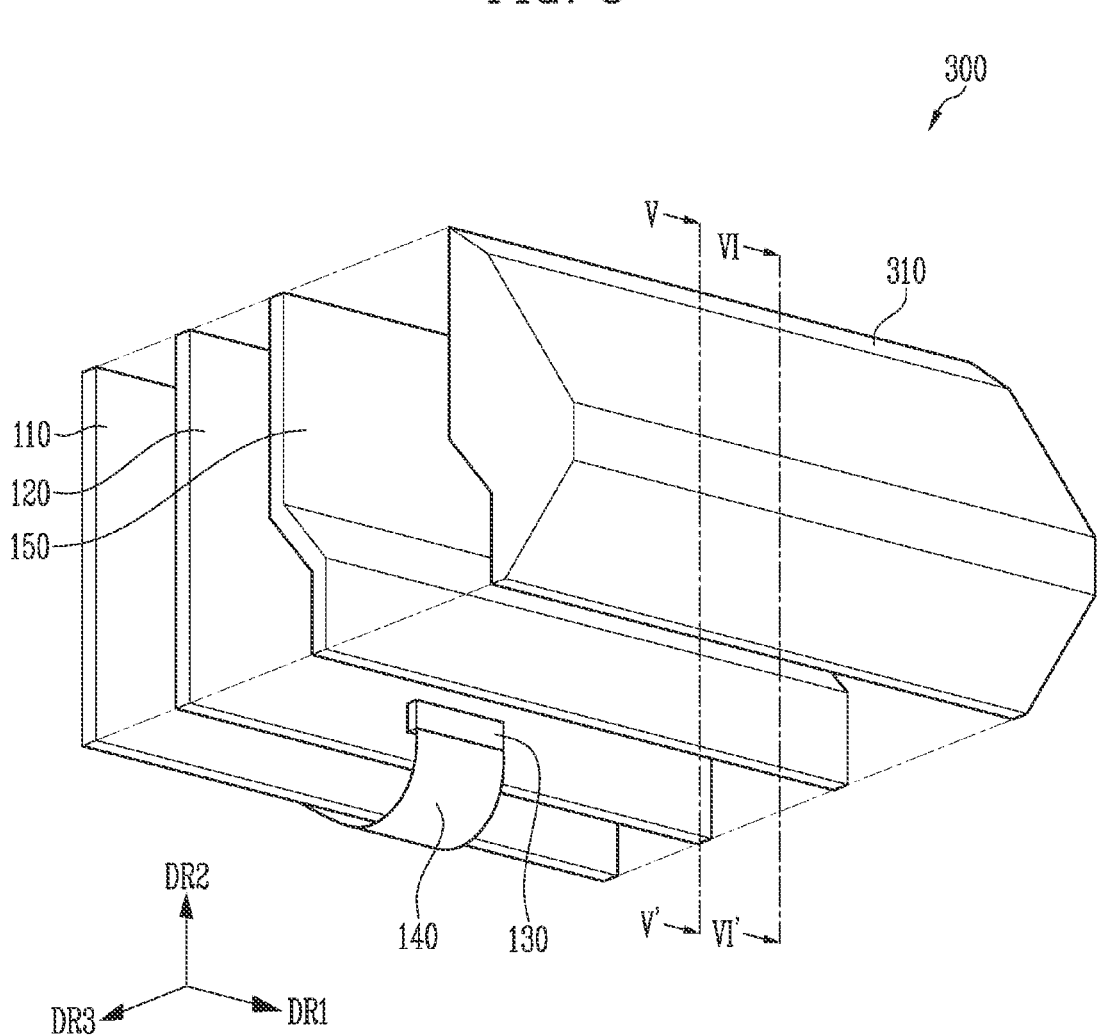
FIG. 8 is an exploded perspective view illustrating a display device in accordance with still another embodiment of the present disclosure.

FIG. 8 is an exploded perspective view illustrating a display device 300 in accordance with still another embodiment of the present disclosure.

Referring to FIG. 8, the display device 300 may include a display panel 110, a heat dissipation sheet 120, a circuit board 130, a connection circuit board 140, a vapor chamber 150, and an additional heat dissipation member 310.

The additional heat dissipation member 310 may overlap with the vapor chamber 150, and the vapor chamber 150 may be disposed between the heat dissipation sheet 120 and the additional heat dissipation member 310. For example, the additional heat dissipation member 310 may cover the vapor chamber 150. The additional heat dissipation member 310 may cover the vapor chamber 150, the heat dissipation sheet 120, and the display panel 110. At least a portion of the additional heat dissipation member 310 may be disposed on the bottom of the display panel 110, the heat dissipation sheet 120, and the vapor chamber 150, to protect the display panel 110, the heat dissipation sheet 120, and the vapor chamber 150 from external impact. The additional heat dissipation member 310 is not limited to the shape shown in FIG. 8.

The additional heat dissipation member 310 may include a material having a high thermal conductivity, such as a tungsten-copper composite material, a molybdenum-copper composite material, or graphite.

The additional heat dissipation member 310 may include a metallic material of which thermal conductivity is not so high, such as stainless steel (SUS) or an electrolytic zinc-coated steel sheet (SECC).

The additional heat dissipation member 310 may receive heat emitted and transferred from the vapor chamber 150.

After that, the additional heat dissipation member 310 may emit the transferred heat to the surrounding environment.

In accordance with an aspect of the present disclosure, the additional heat dissipation member 310 exists may be employed so that heat from the vapor chamber 150 and/or the display device 300 can be more effectively emitted. For example, the additional heat dissipation member 310 may be provided so that heat from the vapor chamber 150 can be more smoothly emitted. Accordingly, heat emission can be improved.

Figure 9:
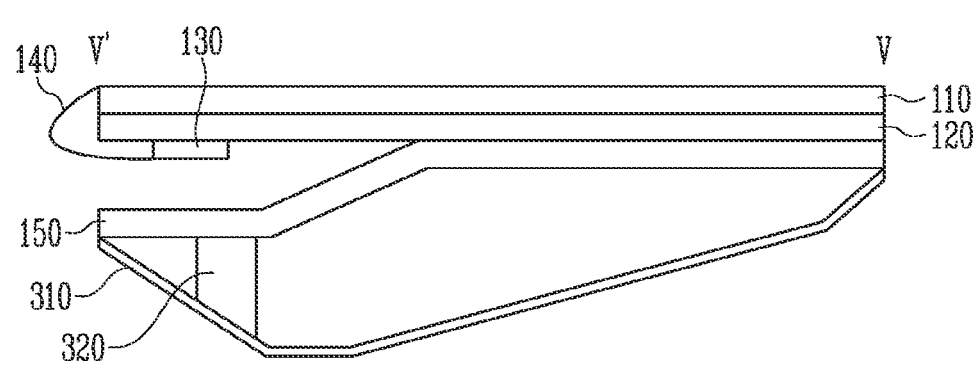
FIG. 9 is a sectional view taken along line V-V' of the display device shown in FIG. 8 in accordance with an embodiment of the present disclosure.
Figure 9:
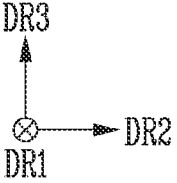

FIG. 9 is a sectional view taken along line V-V' of the display device shown in FIG. 8 in accordance with an embodiment of the present disclosure.

Referring to FIGS. 8 and 9, the display device 300, as compared with the embodiment of FIG. 5, may further include the additional heat dissipation member 310 and an adhesive member 320. The display panel 110, the heat dissipation sheet 120, the circuit board 130, the connection circuit board 140, and the vapor chamber 150 may be respectively configured identically to the display panel 110, the heat dissipation sheet 120, the circuit board 130, the connection circuit board 140, and the vapor chamber 150, which are shown in FIG. 5. Hereinafter, overlapping descriptions will be omitted.

The additional heat dissipation member 310 may be disposed to be adjacent to the vapor chamber 150 in the third direction DR3. The adhesive member 320 may connect the additional heat dissipation member 310 to the vapor chamber 150. More specifically, an adhesive such as resin may be coated on a surface of the adhesive member 320 for attachment to the vapor chamber 150 and the additional heat dissipation member 310. The additional heat dissipation member 310 and the vapor chamber 150 may thus be attached to each other, using the adhesive member 320 on which the adhesive is coated, so that the adhesive member 320 may be interposed between the additional heat dissipation member 310 and the vapor chamber 150. Alternatively, the surface of the adhesive member 320 may have a fixing unit such as a pin or a hook. The additional heat dissipation member 310 may be connected to the vapor chamber 150, using the fixing unit of the surface of the adhesive member 230, such as the pin or the hook.

The adhesive member 320 may include a material having a high thermal conductivity, such as a tungsten-copper composite material, a molybdenum-copper composite material, or graphite.

Figure 10:
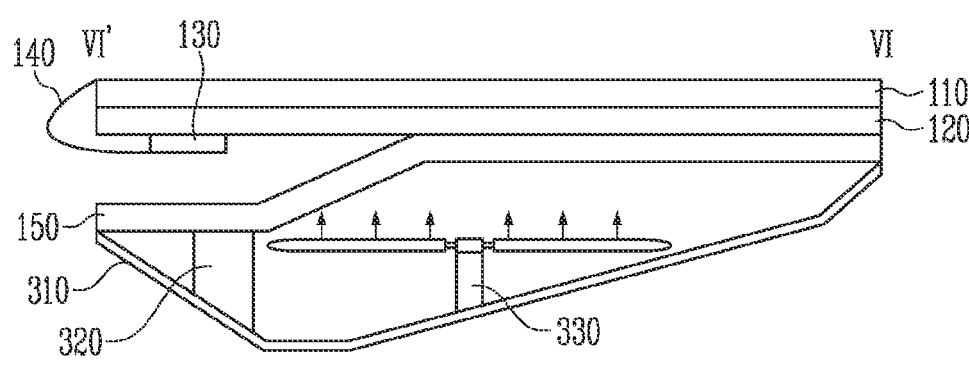
FIG. 10 is a sectional view taken along line VI-VI' of the display device shown in FIG. 8 in accordance with another embodiment of the present disclosure.
Figure 10:
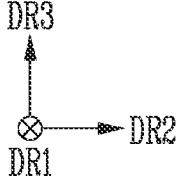

FIG. 10 is a sectional view taken along line VI-VI' of the display device shown in FIG. 8 in accordance with another embodiment of the present disclosure.

Comparing FIG. 10 to FIG. 9, the display device 300 may further include a fan 330.

The fan 330 may be coupled to the additional heat dissipation member 310. The fan 330 may include a rotating member rotating on a rotating shaft that extends in the third direction DR3. The rotating member of the fan 330 may rotate, thereby generating an air current (see arrows shown in FIG. 10).

The air current may reach at least a portion of the external member 151 (see FIG. 3) of the vapor chamber 150. A temperature difference between a portion of the external member 151 in contact with the heat dissipation sheet 120 and the portion of the external member 151, which the air current reaches, may be increased. Convention of the phase change material PCM inside the vapor chamber 150 may be stronger or smoother as a result of the increased temperature difference. Accordingly, heat emission through the vapor chamber 150 can be improved.

In accordance with an aspect of the present disclosure, a display device can use a vapor chamber to uniformly and efficiently remove heat generated in driving of a display panel.

Example embodiments have been disclosed herein, and although specific terms are employed, they are used and are to be interpreted in a generic and descriptive sense only and not for the purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display device comprising:
a display panel;
a heat dissipation sheet disposed on a surface of the display panel;
a circuit board electrically connected to the display panel, the circuit board being disposed on a surface of the heat dissipation sheet; and
a vapor chamber attached to the surface of the heat dissipation sheet to emit heat transferred through the heat dissipation sheet,
wherein the circuit board overlaps with a first area of the heat dissipation sheet, and
wherein a first part of the vapor chamber is attached to and in direct contact with no intervening elements with a second area of the heat dissipation sheet, and
a second part of the vapor chamber is spaced apart from the heat dissipation sheet.

2. The display device of claim 1, wherein the vapor chamber includes:
an external member defining an internal space; and
a phase change material disposed in the internal space, the phase change material being convected by the heat transferred through the heat dissipation sheet, thereby emitting the heat transferred through the heat dissipation sheet.

3. The display device of claim 2, wherein the vapor chamber includes an absorbing sheet disposed in the internal space of the external member, the absorbing sheet including a plurality of holes, thereby absorbing the phase change material.

4. The display device of claim 1, wherein the second part of the vapor chamber extends from the first part of the vapor chamber and forms a first angle with the first part of the vapor chamber, and
wherein a third part of the vapor chamber extends from the second part of the vapor chamber and forms a second angle with the second part of the vapor chamber.

5. The display device of claim 1, further comprising an additional heat dissipation member coupled to the vapor chamber through an adhesive member,
wherein the vapor chamber is disposed between the heat dissipation sheet and the additional heat dissipation member.

6. The display device of claim 5, wherein the additional heat dissipation member includes at least one of a tungsten-copper composite material, a molybdenum-copper composite material, graphite, stainless steel, and an electrolytic zinc-coated steel sheet.

7. The display device of claim 5, further comprising a rotating member coupled to the additional heat dissipation member, the rotating member generating an air current toward the vapor chamber.

8. A display device comprising:

a display panel;

a heat dissipation sheet disposed on a surface of the display panel;

a vapor chamber attached to a surface of the heat dissipation sheet, to emit heat transferred through the heat dissipation sheet; and a circuit board electrically connected to the display panel, the circuit board being attached to the heat dissipation sheet, wherein the circuit board overlaps with a first area of the heat dissipation sheet, and wherein a first part of the vapor chamber is attached to and in direct contact with no intervening elements with a second area of the heat dissipation sheet, and second and third parts of the vapor chamber are spaced apart from the heat dissipation sheet.

9. The display device of claim 8, wherein the vapor chamber includes:

an external member defining an internal space; and a phase change material disposed in the internal space, the phase change material being convected by the heat transferred through the heat dissipation sheet, thereby emitting the heat transferred through the heat dissipation sheet.

10. The display device of claim 9, wherein the vapor chamber includes an absorbing sheet disposed in the internal space of the external member, the absorbing sheet including a plurality of holes, thereby absorbing the phase change material.

11. The display device of claim 8, wherein the second part of the vapor chamber extends in a direction intersecting an extending direction of the first part of the vapor chamber from the first part of the vapor chamber, and the third part of the vapor chamber extends in a direction intersecting an extending direction of the second part of the vapor chamber from the second part of the vapor chamber.

12. The display device of claim 11, wherein the third part of the vapor chamber is parallel to the first part of the vapor chamber.

13. The display device of claim 11, wherein the second part of the vapor chamber is right-angled with respect to the first part of the vapor chamber, and the third part of the vapor chamber is right-angled with the second part of the vapor chamber.

14. The display device of claim 1 wherein the second part of the vapor chamber is not in direct contact with the heat dissipation sheet.

15. The display device of claim 8 wherein the second and third parts of the vapor chamber are not in direct contact with the heat dissipation sheet.

\* \* \* \* \*